(12) United States Patent
Lam et al.

(10) Patent No.: US 9,306,526 B2
(45) Date of Patent: Apr. 5, 2016

(54) LOW-LOSS HIGH-ISOLATION SWITCHING ARCHITECTURE

(71) Applicant: Skyworks Solutions, Inc., Woburn, MA (US)

(72) Inventors: Lui Lam, Winchester, MA (US); William Gerard Vaillancourt, Methuen, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 330 days.

(21) Appl. No.: 13/892,125

(22) Filed: May 10, 2013

(65) Prior Publication Data

US 2013/0321095 A1  Dec. 5, 2013

Related U.S. Application Data

(60) Provisional application No. 61/646,250, filed on May 11, 2012.

(51) Int. Cl.
*H04B 1/44* (2006.01)
*H03H 2/00* (2006.01)
*H04B 1/48* (2006.01)

(52) U.S. Cl.
CPC . *H03H 2/005* (2013.01); *H04B 1/48* (2013.01)

(58) Field of Classification Search
CPC .................................. H03H 2/005; H04B 1/48
USPC ............................................................ 455/78
See application file for complete search history.

(56) References Cited

U.S. PATENT DOCUMENTS

| | | | |
|---|---|---|---|
| 8,723,260 B1 * | 5/2014 | Carroll et al. | 257/347 |
| 2006/0246855 A1 * | 11/2006 | Kato | H04B 1/0483 455/102 |
| 2009/0298443 A1 * | 12/2009 | Ta et al. | 455/83 |
| 2011/0105026 A1 * | 5/2011 | Hsiao | H04B 1/006 455/41.2 |

* cited by examiner

*Primary Examiner* — Wesley Kim
*Assistant Examiner* — Raj Chakraborty
(74) *Attorney, Agent, or Firm* — Knobbe Martens Olson & Bear LLP

(57) ABSTRACT

Disclosed are switching circuits and methods that enable a device to switch between two wireless protocols with antenna sharing. In some implementations, the device may use two different wireless protocols concurrently and with high isolation. In some implementations, the device can be provided with insertion loss matched transmission diversity for one of the wireless protocols. In some embodiments, various signal paths and related switches that allow such functionalities can be implemented on a single die such as a silicon-on-insulator (SOI) die.

20 Claims, 6 Drawing Sheets

LOW-LOSS HIGH-ISOLATION SWITCHING ARCHITECTURE

CROSS-REFERENCE TO RELATED APPLICATIONS

This application claims priority to U.S. Provisional Application No. 61/646,250 filed May 11, 2012 and entitled "LOW-LOSS HIGH-ISOLATION SWITCHING ARCHITECTURE," which is expressly incorporated by reference herein in its entirety.

BACKGROUND

1. Field

The present disclosure relates to circuits and methods for providing low loss and high isolation in switching architectures for radio-frequency (RF) applications.

2. Description of the Related Art

In radio-frequency (RF) communication systems, a switching circuit can be utilized to route various signal between a transmitter, a receiver, and/or a transceiver and one or more antennas. In some designs, an antenna can be shared amongst more than one receiver, transmitter, or transceiver.

SUMMARY

In some implementations, the present disclosure relates to a switching circuit that includes a first signal path between a transmit terminal and a first antenna terminal. The switching circuit further includes a second signal path between the transmit terminal and a second antenna terminal. The switching circuit is configured to be capable of operating in a first mode in which the transmit terminal is provided with access to the first antenna terminal through the first signal path with a first insertion loss or the second antenna terminal through the second signal path with a second insertion loss. The first insertion loss substantially matches the second insertion loss. The switching circuit further includes a third signal path between a transceiver terminal and the second antenna terminal. The switching circuit is further configured to be capable of operating in a second mode in which the transmit terminal is provided with access to the first antenna terminal and the transceiver terminal is concurrently provided with access to the second antenna terminal.

In some embodiments, the first signal path can include a switch and an insertion loss component connected in series. The insertion loss component can include an additional switch. In some embodiments, the first signal path can further include a DC block capacitance between the switch and the transmit terminal. The DC block capacitance can be shared by the first signal path and the second signal path. In some embodiments, switching circuit can further include a switchable shunt circuit that couples a node between the switch and the DC block capacitance with an electrical ground. The switchable shunt circuit can include a switch and a capacitance connected in series.

In some embodiments, the second signal path can include a first switch in series with a second switch. The switching circuit can further include a switchable shunt circuit that couples a node between the first and second switches of the second signal path with an electrical ground. The switchable shunt circuit can include a switch and a capacitance connected in series.

In some embodiments, the third signal path can be a bidirectional signal path. The bidirectional signal path can include a switch. The bidirectional signal path can further include a DC block capacitance between the switch and the transceiver terminal. The switching circuit can further include a switchable shunt circuit that couples a node between the switch and the DC block capacitance with an electrical ground. The switchable shunt circuit can include a switch and a capacitance connected in series.

In some embodiments, the switching circuit can further include a fourth signal path between a receive terminal and the first antenna terminal. The fourth signal path can include a switch. The fourth signal path can further include a DC block capacitance between the switch and the receive terminal. The switching circuit can further include a switchable shunt circuit that couples a node between the switch and the DC block capacitance with an electrical ground. The switchable shunt circuit can include a switch and a capacitance connected in series.

In some embodiments, the switching circuit can further include a fifth signal path between the receive terminal and the second antenna terminal. The fifth signal path can include a first switch in series with a second switch. The fifth signal path can further include a DC block capacitance between the first switch and the receive terminal. The switching circuit can further include a switchable shunt circuit that couples a node between the first switch and the DC block capacitance with an electrical ground. The switching circuit can further include a switchable shunt circuit that couples a node between the first and second switches with an electrical ground. The switchable shunt circuit can include a switch and a capacitance connected in series. In some embodiments, the switching circuit can be further configured to be capable of operating in a third mode in which the receive terminal is provided with access to the first antenna terminal or the second antenna terminal.

In some embodiments, the first, second and third signal paths can be formed on a common die. In some embodiments, the common die can further include the fourth and fifth signal paths. In some embodiments, the common die can be a silicon-on-insulator (SOI) die.

In some embodiments, the transmit terminal can be for connection to a transmitter operating in accordance with a first wireless protocol which utilizes transmission diversity, and the transceiver terminal can be for connection to a transceiver operating in accordance with a second wireless protocol. The first wireless protocol can include WiFi, SE2615, or SE2621. The second wireless protocol can include Bluetooth.

In some embodiments, the first insertion loss can be substantially equal to the second insertion loss.

In accordance with a number of implementations, the present disclosure relates to a die having a switching circuit. The die includes a substrate that includes a semiconductor material. The die further includes a transmit terminal, a transceiver terminal, a first antenna terminal, and a second antenna terminal, each formed on the substrate. The die further includes a first signal path formed on the substrate. The first signal path is configured to allow the transmit terminal to be in communication with the first antenna terminal with a first insertion loss. The die further includes a second signal path formed on the substrate. The second signal path is configured to allow the transmit terminal to be in communication with the second antenna terminal with a second insertion loss. The first insertion loss substantially matches the second insertion loss. The die further includes a third signal path formed on the substrate. The third signal path is configured to allow the transceiver terminal to be in communication with the second antenna terminal.

In some embodiments, the die can further include a receive terminal formed on the substrate. The die can further include a fourth signal path formed on the substrate. The fourth signal path can be configured to allow the receive terminal to be in communication with the first antenna terminal. The die can further include a fifth signal path formed on the substrate. The fifth signal path can be configured to allow the receive terminal to be in communication with the second antenna terminal.

In some embodiments, the die can be a silicon-on-insulator (SOI) die.

According to a number of implementations, the present disclosure relates to a method for fabricating a switching circuit on a die. The method includes providing or forming a substrate that includes a semiconductor material. The method further includes forming on the substrate a transmit terminal, a transceiver terminal, a first antenna terminal, and a second antenna terminal. The method further includes forming a first signal path on the substrate to allow the transmit terminal to be in communication with the first antenna terminal with a first insertion loss. The method further includes forming a second signal path on the substrate to allow the transmit terminal to be in communication with the second antenna terminal with a second insertion loss. The first insertion loss substantially matches the second insertion loss. The method further includes forming a third signal path on the substrate to allow the transceiver terminal to be in communication with the second antenna terminal.

According to some implementations, the present disclosure relates to a switching module that includes a packaging substrate configured to receive a plurality of components. The module further includes a die mounted on the packaging substrate. The die has a switching circuit that includes a transmit terminal, a transceiver terminal, a first antenna terminal, and a second antenna terminal. The switching circuit further includes a first signal path configured to allow the transmit terminal to be in communication with the first antenna terminal with a first insertion loss. The switching circuit further includes a second signal path configured to allow the transmit terminal to be in communication with the second antenna terminal with a second insertion loss. The first insertion loss substantially matches the second insertion loss. The switching circuit further includes a third signal path configured to allow the transceiver terminal to be in communication with the second antenna terminal.

In a number of implementations, the present disclosure relates to a packaged module for a radio-frequency (RF) device. The module includes a packaging substrate configured to receive a plurality of components. The module further includes a switching circuit implemented on a common die. The switching circuit is configured to allow antenna-sharing and antenna-diversity among first and second radio-frequency circuits having different communication protocols. In some embodiments, the common die can be a silicon-on-insulator (SOI) die.

In some implementations, the present disclosure relates to a wireless device that includes a plurality of antennas. The wireless device further includes a first radio-frequency (RF) circuit capable of being in communication with one or more of the plurality of antennas. The first RF circuit is configured to operate with a first communication protocol. The wireless device further includes a second RF circuit capable of being in communication with one or more of the plurality of antennas. The second RF circuit is configured to operate with a second communication protocol. The wireless device further includes a switching module having a switching circuit implemented on a common die. The switching circuit is configured to allow antenna-sharing and antenna-diversity among the first and second radio-frequency circuits operating with their respective communication protocols.

According to a number of implementations, the present disclosure relates to a switching circuit that includes a first transmit signal pathway between a transmit terminal and a first antenna terminal, the first transmit signal pathway having a first at least one switch and an insertion loss component in series. The switching circuit further includes a second transmit signal pathway between the transmit terminal and a second antenna terminal, the second transmit signal pathway having a second at least one switch in series with an at least one common switch. A portion of the second transmit pathway between the second at least one switch and the at least one common switch is electrically coupled through a first shunt switch to ground. The switching circuit further includes a bidirectional signal pathway between a transceiver terminal and the second antenna terminal. The bidirectional signal pathway includes a first switch. The switching circuit is operable for: in a first mode, supporting transmission diversity for the transmit terminal by opening the first switch, opening the first shunt switch, and dynamically alternating between closing the first at least one switch and opening the second at least one switch; and opening the first at least one switch, closing the second at least one switch, and ensuring the at least one common switch is closed, an insertion loss between the transmit terminal and the first antenna terminal along the first transmit pathway when in use matches an insertion loss between the transmit terminal and the second antenna terminal along the second transmit pathway when in use; and in a second mode, providing access by the transmit terminal to the first antenna terminal and concurrently access by the transceiver terminal to the second antenna terminal by closing the first at least one switch, opening the second at least one switch, opening the at least one common switch, closing the first switch, and closing the first shunt switch, such that high isolation between the first transmit signal pathway and the bidirectional signal pathway is provided.

In some implementations, the present disclosure relates to a method that includes providing a switching circuit having a first transmit signal pathway between a transmit terminal and a first antenna terminal, the first transmit signal pathway including a first at least one switch and an insertion loss component in series, the switching circuit further including a second transmit signal pathway between the transmit terminal and a second antenna terminal, the second transmit signal pathway having a second at least one switch in series with an at least one common switch. A portion of the second transmit pathway between the second at least one switch and the at least one common switch is electrically coupled through a first shunt switch to ground. The switching circuit further includes a bidirectional signal pathway between a transceiver terminal and the second antenna terminal, the bidirectional signal pathway having a first switch. The method further includes operating the switching circuit in a first mode of operation for supporting transmission diversity for the transmit terminal, the first mode of operation that includes opening the first switch, opening the first shunt switch, and dynamically alternating between closing the first at least one switch and opening the second at least one switch, and opening the first at least one switch, the first mode of operation further including closing the second at least one switch, and ensuring the at least one common switch is closed, such that an insertion loss between the transmit terminal and the first antenna terminal along the first transmit pathway when in use matches an insertion loss between the transmit terminal and the second antenna terminal along the second transmit pathway when in use. The method further includes operating the switching circuit in a second mode of operation for providing access by the transmit terminal to the first antenna terminal and concurrently access by the transceiver terminal to the second antenna terminal, the second mode of operation including closing the first at least one switch, opening the second at least one switch, opening the at least one common switch, closing the first switch, and closing the first shunt switch, such that high isolation between the first transmit signal pathway and the bidirectional signal pathway is provided.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In some implementations, the present disclosure relates to switching architectures for communication devices. In more specific example implementations, one or more features of the present disclosure can be applied to switching architectures for antenna diversity and antenna sharing.

In modern radio-frequency (RF) communication systems, a semiconductor-based transmit-receive switch is often the last/first component encountered by a transmitted/received signal before/after encountering one or more antennas. Often to conserve space and reuse components efficiently, an antenna can be shared amongst more than one receiver, transmitter, or transceiver, each of which may deal with a different wireless protocol. By way of examples, in many modern devices, both WiFi (WLAN) and Bluetooth transceivers (or transmitter and receiver pairs) can be present, and share at least one antenna.

In order to improve communications for some wireless protocols, a technique known as antenna diversity can be implemented. In the specific example case of WiFi communications, polarization diversity is often used. Wireless signals are often received at a device in unpredictable polarization orientations. This may be due to changes in orientation of the transmitting or receiving device or may be due to reflections or transmissions of the signal as it traverses the environment from the transmitting device to the receiving device. A misalignment and/or mismatching of polarization can cause poor reception and signal fade which may be substantial. For example, a linear polarization misalignment of 90° can result in signal attenuation of 20 dB or more.

In general, polarization diversity can utilize two antennas with orthogonal polarizations. In the case of linear polarized antennas, the antennas can be aligned at 90° with respect to each other, and in the case of circularly polarized antennas, one antenna can be left-hand circularly polarized while the other can be right-hand circularly polarized. The misalignment or mismatching of polarization can be compensated for with antenna diversity provided at the receiving device or with antenna diversity provided at the transmitting device. In the example context of dynamically selecting for use, either in transmission or reception, one of two antennas in an orthogonal arrangement can greatly reduce signal fade due to polarization effects.

Figure 1:
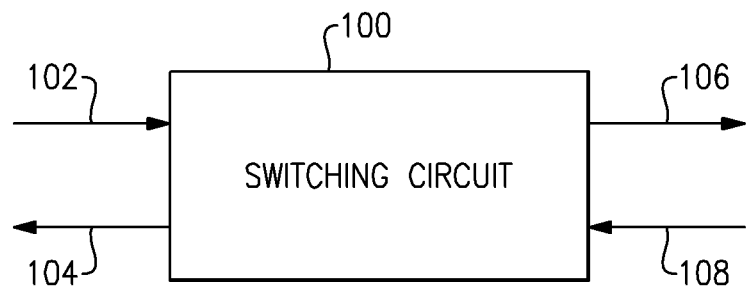
FIG. 1 schematically depicts a switching circuit that can be configured to include one or more features as described herein.

FIG. 1 schematically depicts a switching circuit 100 that can be configured to include one or more features as described herein. In some embodiments, such a switching circuit can be implemented to receive one or more inputs (e.g., 102, 108) of RF signal(s) and route such signal(s) to one or more outputs (e.g., 104, 106). Examples of such switching circuits are described herein in greater detail.

Figure 2:
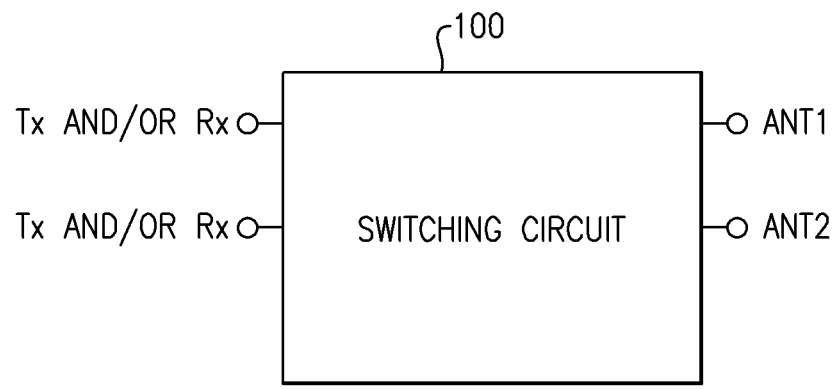
FIG. 2 shows an example of the configuration of FIG. 1.

FIG. 2 shows an example of a switching circuit 100 that can be implemented to route RF signals to and/or from a plurality of antennas (e.g., ANT1 and ANT1) for a plurality of RF signal paths associated with their corresponding modes of operation. Examples of such signal paths and the corresponding modes are described herein in greater detail. Although described in the example context of routing RF signals to and/or from antennas, it will be understood that one or more features of present disclosure can also be implemented in other types of RF applications.

Figure 3A:
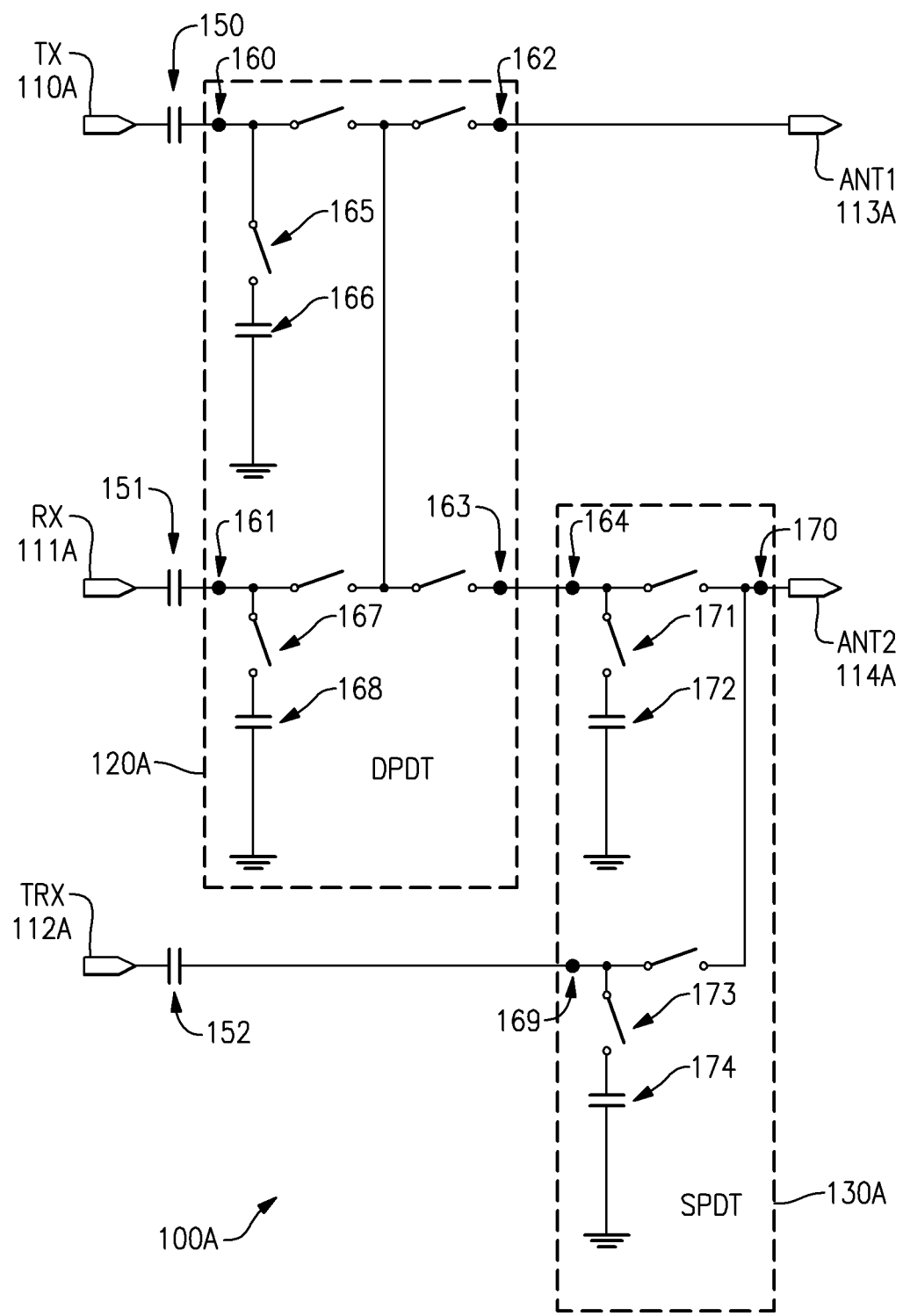
FIG. 3A shows an example of a switching architecture utilizing a back-to-back configured DPDT switch and SPDT switch.
Figure 3B:
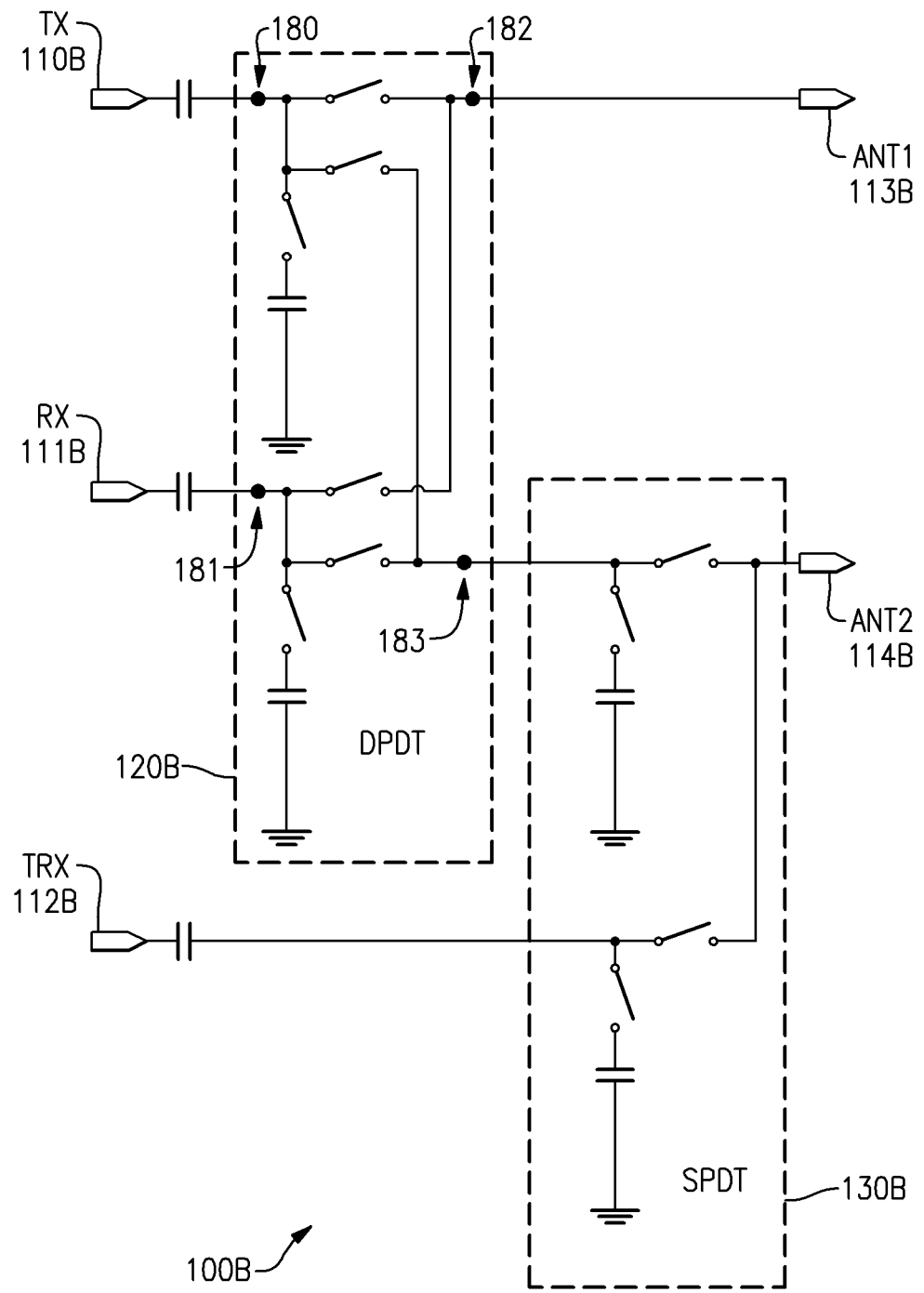
FIG. 3B shows an example of a switching architecture utilizing a diamond configured DPDT switch and SPDT switch.

Two example architectures for providing both antenna sharing and antenna diversity are depicted respectively in FIG. 3A and FIG. 3B. Both examples depict a double pole double throw (DPDT) switch for WiFi coupled to a single pole double throw (SPDT) switch for Bluetooth functionality. FIG. 3A depicts a DPDT in a back-to-back configuration while FIG. 3B depicts a DPDT in a diamond configuration.

In FIG. 3A, an example switching architecture 100A includes a WiFi transmit terminal 110A (TX) that can be coupled to a WiFi transmitter (not shown), and a WiFi receive terminal 111A (RX) that can be coupled to a WiFi receiver (not shown). Each of the WiFi transmit and receive terminals 110A, 111A can be coupled across a respective DC blocking capacitance (150, 151) to respective transmit and receive terminals (160, 161) of a DPDT switch 120A. The DPDT switch 120A can be configured to switch signals between each of the transmit and receive terminals (160, 161) to either a first terminal 162 or a second terminal 163 in a "back-to-back" fashion. The first terminal 162 can be coupled to a first antenna terminal 113A (ANT1) which can be coupled to a first antenna (not shown). The second terminal 163 can be coupled to a first terminal 164 of an SPDT switch 130A.

In some embodiments, each of the terminals 160, 161 of the DPDT switch 120A may switchably be shunted across a respective DC blocking capacitance to ground. For example, the terminal 160 can be shunted to ground through a switch 165 and a DC blocking capacitor 166. Similarly, the terminal 161 can be shunted to ground through a switch 167 and a DC blocking capacitor 168.

The switching architecture 100A can also include a Bluetooth terminal 112A (TRX) that can be coupled to a Bluetooth transceiver (not shown). The Bluetooth terminal 112A can be coupled across a DC blocking capacitor 152 to a second terminal 169 of the SPDT switch 130A. The SPDT switch 130A can be configured to switch signals between each of the first and second terminals 164, 169 to terminal 170 that is coupled to a second antenna terminal 114A (ANT2), which in turn can be coupled to a second antenna (not shown).

In some embodiments, each of the first and second terminals 164, 169 of the SPDT switch 130A may switchably be shunted across a respective DC blocking capacitance to ground. For example, the terminal 164 can be shunted to ground through a switch 171 and a DC blocking capacitor 172. Similarly, the terminal 169 can be shunted to ground through a switch 173 and a DC blocking capacitor 174.

An example switching architecture 100B of FIG. 3B can be generally the same as that of FIG. 3A, except that a double pole double throw (DPDT) switch 120B of FIG. 3B can be configured to connect each of a transmit terminal 180 and a receive terminal 181 of the DPDT switch 120B to each of a first terminal 182 and a second terminal 183, also of the DPDT switch 120B, using a "diamond" configuration.

In the example architecture 100A of FIG. 3A, the DPDT switch 120A and the SPDT switch 130A are typically formed on separate integrated chip (IC) packages. Similarly, in the example architecture 100B of FIG. 3B, the DPDT switch 120B and the SPDT switch 130B are typically formed on separate IC packages.

In some situations, a drawback associated with the example switch architectures 100A, 100B can include a need to perform multiple calibrations to ensure transmission power level matching when switching between the antennas used by the WiFi transmitter, and more particularly, during use in transmitting in an antenna diversity mode. Since the DPDT switch (120A or 120B) is implemented on a separate IC package from the SPDT switch (130A or 130B), and since the transmit pathway from the WiFi transmit terminal (110A or 110B) to the first antenna terminal (113A or 113B) is composed of a different number of switching elements than that of the transmit pathway from the WiFi transmit terminal (110A or 110B) to the second antenna terminal (114A or 114B), there can be a mismatch in the insertion loss from the transmitter to each of the two antennas. Such a mismatch can often be sufficiently large that separate calibrations for power levels is required. For example, a calibration of the transmit power used for each antenna is customarily required to compensate for approximately a 0.5 dB difference caused by the path losses between the transmit terminal and the respective antenna terminal.

A modification which may be made to the example switch architectures 100A, 100B can be to obtain a matching insertion loss when switching between the antennas used by the WiFi transmitter. Such a modification can involve a removal of the shunt to ground and the switch nearest to the second antenna terminal 114A, 114B along the path between the second antenna terminal 114A, 114B and the receive terminal 111A, 111B. In such a variation of the example architectures 100A, 100B, although each of the transmit, receive, and Bluetooth terminals 110A, 110B, 111A, 111B, 112A, 112B, has an associated switchable shunt to ground, the connection between the input terminal of the SPDT switch 130A, 130B and the DPDT switch 120A, 120B would no longer be able to provide a high isolation that may be required for concurrent WiFi and Bluetooth functionality. A consequence of the failure of such a modification to provide concurrent use of WiFi and Bluetooth is that the example architectures 100A, 100B can forgo insertion loss matching in order to provide the high isolation required for concurrent operation of WiFi and Bluetooth in a communication device with antenna diversity and antenna sharing.

Figure 4:
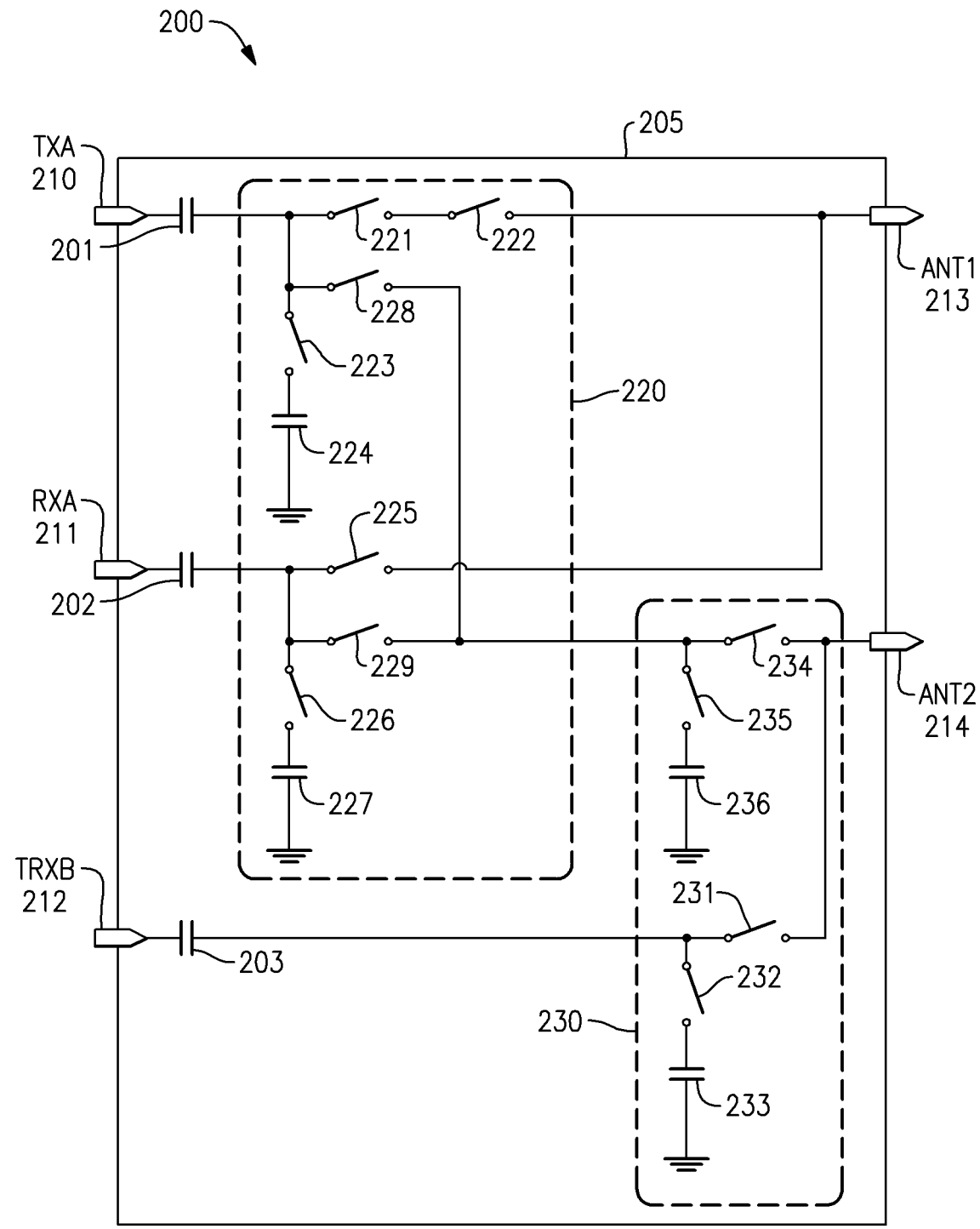
FIG. 4 shows an example of a switching circuit having an insertion loss matching architecture.

Referring to FIG. 4, a switching circuit 200 can be configured to provide both insertion loss matching and high isolation. Various features and examples associated with the example switching circuit 200 are described herein in greater detail.

In some implementations, the example switching circuit 200 can generally include two sub-circuits, a first sub-circuit 220 that can be structured similarly to a DPDT switch in a diamond configuration, and a second sub-circuit 230 that can be structured similarly to an SPDT switch. A transmit terminal 210 (TXA) can be coupled to a first side of a first blocking capacitor 201. A second side of the first blocking capacitor 201 can be coupled across a first switch 221 and a second switch 222 in series to a first antenna terminal 213 (ANT1). The second side of the first blocking capacitor 201 can also be coupled across a third switch 223 and a second blocking capacitor 224 in series to ground.

A receive terminal 211 (RXA) can be coupled to a first side of a third blocking capacitor 202. A second side of the third blocking capacitor 202 can be coupled across a fourth switch 225 to the first antenna terminal 213 (ANT1). The second side of the third blocking capacitor 202 can also be coupled across a fifth switch 226 and a fourth blocking capacitor 227 in series to ground.

A transceiver terminal 212 (TRXB) can be coupled to a first side of a fifth blocking capacitor 203. A second side of the fifth blocking capacitor 203 can be coupled across a sixth switch 231 to a second antenna terminal 214 (ANT2). The second side of the fifth blocking capacitor 203 can also be coupled across a seventh switch 232 and a sixth blocking capacitor 233 in series to ground.

The second antenna terminal 214 (ANT2) can be coupled across an eighth switch 234 and a ninth switch 228 in series to the second side of the first blocking capacitor 201. The second antenna terminal 214 (ANT2) can also be coupled across the eighth switch 234 and a tenth switch 229 in series to the second side of the third blocking capacitor 202. The second antenna terminal 214 (ANT2) can also be coupled across the eighth switch 234 and an eleventh switch 235 and across a seventh blocking capacitor 236 in series to ground.

The third switch 223, fifth switch 226, seventh switch 232, and eleventh switch 235 can be configured to function as shunt switches since they control shunting to ground of respectively, the transmit terminal 210, the receive terminal 211, the transceiver terminal 212, and the portion of the signal paths coincident and between the eighth switch 234, the ninth switch 228, and the tenth switch 229.

In some embodiments, some or all of the aforementioned elements of the switching circuit 200 can be integrated on a single SOI (silicon on insulator) device 205 such as a die. In some embodiments, the switching circuit 200 can be implemented with multiple semiconductor chips. The switches can be implemented as MOSFETs, BJTs, JFETs, IGBTs or any other semiconductor switch appropriate to the chip implementation of the switching circuit 200.

The blocking capacitors may be any kind of integrated capacitor of the appropriate capacity for DC blocking. In some embodiments, external blocking capacitors can be present at the transmit terminal 210, the receive terminal 211, and the transceiver terminal 212, and therefore blocking capacitors 201, 202, and 203 may not be present in the switching circuit 200. In other embodiments, in addition to the blocking capacitors 201, 202, and 203 adjacent the transmit terminal 210, the receive terminal 211, and the transceiver terminal 212, respectively, blocking capacitors (not shown) can be included in the switching circuit 200 immediately before the first and second antenna terminals 213, 214 along the signal pathways connected thereto.

The switching circuit 200 will now be discussed in terms of its function. The first sub-circuit 220 which includes the first, second, third, fourth, fifth, ninth, and tenth switches 221, 222, 223, 225, 226, 228, 229, along with the second and fourth blocking capacitors 224, 227 can be configured to perform similar functions as a DPDT switch. The first sub-circuit 220, however, is not a standard DPDT switch as it includes two switches (e.g., the first switch 221 and the second switch 222) in series along the signal pathway between the transmit terminal 210 and the first antenna terminal 213.

The second sub-circuit 230 which includes the sixth, seventh, eighth, and eleventh switches 231, 232, 234, 235, along with the sixth and seventh blocking capacitors 233, 236 can be configured to perform similar functions as an SPDT switch.

The transmit terminal 210 and the receive terminal 211 can be configured for coupling to a transmitter and a receiver (not shown) respectively of a first wireless protocol which can utilize antenna diversity. The transceiver terminal 212 can be configured for coupling to a transceiver (not shown) which utilizes a second wireless protocol. Each of the blocking capacitors can be configured for blocking any DC signal from passing to and from each respective terminal or ground which is coupled to one side thereof.

The first antenna terminal 213 and the second antenna terminal 214 can be configured for coupling to a respective first and second antenna (not shown) which can be oriented, or otherwise arranged relative to each other as desired to provide the kind of antenna diversity utilized by the first wireless protocol. The antennas can be external to the switching circuit 200 and it is assumed that the switching circuit 200 can be utilized in a context in which the two antennas of the antenna diversity being implemented are in fact oriented, arranged, or otherwise appropriate to the application.

It is to be understood, and is quite clear from the figures and the description herein, that the switching circuit 200, including switches, capacitors and terminals, may be utilized in the context of any two wireless protocols, since the structure and elements of the switching circuit can be protocol independent.

An example application for the embodiment depicted in FIG. 4 can include antenna diversity and sharing for WiFi and Bluetooth. In such an application, the first wireless protocol can be the WiFi wireless protocol, and the second wireless protocol can be the Bluetooth protocol. Accordingly, the transmit terminal 210 can be coupled to a WiFi transmitter, the receive terminal 211 can be coupled to a WiFi receiver, and the transceiver terminal 212 can be coupled to a Bluetooth transceiver. In the example application, the main type of antenna diversity utilized by the WiFi transmitter and receiver could, for example, be polarization diversity. As is shown in FIG. 4, in the context of the example application, the switching circuit 200 can provide antenna sharing of the second antenna among the WiFi transmitter, the WiFi receiver, and the Bluetooth transceiver, and also provides antenna diversity for the WiFi transmitter and receiver.

As is described in greater detail herein, and unlike other architectures providing antenna diversity and antenna sharing, the example switching circuit 200 can provide antenna diversity and antenna sharing with both high isolation (e.g., between the equipment of a first wireless protocol and the transceiver of a second wireless protocol), and insertion loss matching (e.g., for the equipment of the first wireless protocol when operating in a transmission diversity mode).

Optionally, TRXB 212 and ANT2 214 can provide low loss operation. For example, the position of the switching structure 231, 232 can allow for low loss transmit/receive functions.

In some implementations, the switching circuit 200 can function generally in any one of four states at any one time. Each of these states along with a corresponding example configuration of the switches within the switching circuit 200 is discussed in turn below.

In a first example state, the switching circuit 200 can provide a first receive signal pathway between the first antenna terminal 213 (ANT1) and the receive terminal 211 (RXA), and provide a bidirectional signal pathway between the second antenna terminal 214 (ANT2) and the transceiver terminal 212 (TRXB). The first state can be achieved by the following example configuration: closing the sixth switch 231 to provide the signal pathway between the transceiver terminal 212 (TRXB) and the second antenna terminal 214 (ANT2); closing the fourth switch 225 to provide the signal pathway between the first antenna terminal 213 (ANT1) and the receive terminal 211 (RXA); opening the first, second, and ninth switches 221, 222, 228 and closing the third switch 223 to shunt the transmit terminal 210 (TXA) to ground and to provide isolation between the transmit terminal 210 (TXA) and each of the remaining terminals 211, 212, 213, 214 (RXA, TRXB, ANT1, ANT2); opening the fifth, seventh, tenth, and eighth switches 226, 232, 229, 234, so that none of the receive terminal 211 (RXA), transceiver terminal 212 (TRXB), and the second antenna terminal 214 (ANT2) is shunted to ground; and closing the eleventh switch 235 to provide a high degree of isolation between the bidirectional signal pathway and the first receive signal pathway.

In a second example state, the switching circuit 200 can provide a first transmit signal pathway between the first antenna terminal 213 (ANT1) and the transmit terminal 210 (TXA), and provide a bidirectional signal pathway between the second antenna terminal 214 (ANT2) and the transceiver terminal 212 (TRXB). The second state can be achieved by the following example configuration: closing the sixth switch 231 to provide the signal pathway between the transceiver terminal 212 (TRXB) and the second antenna terminal 214 (ANT2); closing the first and second switches 221, 222 to provide the signal pathway between the first antenna terminal 213 (ANT1) and the transmit terminal 210 (TXA); opening the fourth and tenth switches 225, 229 and closing the fifth switch 226 to shunt the receive terminal 211 (RXA) to ground and to provide isolation between the receive terminal 211 (RXA) and each of the remaining terminals 210, 212, 213, 214 (TXA, TRXB, ANT1, ANT2); opening the third, seventh, ninth, and eighth switches 223, 232, 228, 234, so that none of the transmit terminal 210 (TXA), the transceiver terminal 212 (TRXB), and the second antenna terminal 214 (ANT2) is shunted to ground; and closing the eleventh switch 235 to provide a high degree of isolation between the bidirectional signal pathway and the first transmit signal pathway.

In a third example state, the switching circuit 200 does not utilize the first antenna terminal 213 (ANT1) and can provide a second receive signal pathway between the second antenna terminal 214 (ANT2) and the receive terminal 211 (RXA). The third state can be achieved by the following example configuration: closing the tenth and eighth switches 234, 229 to provide the signal pathway between the receive terminal 211 (RXA) and the second antenna terminal 214 (ANT2); opening the fourth and ninth switches 225, 228, and closing the third switch 223, in order to shunt the transmit terminal 210 (TXA) to ground and isolate the transmit terminal 210 (TXA) and the first antenna terminal 213 (ANT1) from the signal pathway between the receive terminal 211 (RXA) and the second antenna terminal 214 (ANT2); opening the sixth switch 231, and closing the seventh switch 232 in order to shunt the transceiver terminal 212 (TRXB) to ground and isolate the transceiver terminal 212 (TRXB) from the remaining terminals; and opening the fifth and eleventh switches 226, 235 to prevent the receive terminal 211 (RXA) and the second antenna terminal 214 (ANT2) from being shunted to ground. The first and second switches 221, 222 may be kept open to isolate the first antenna terminal 213 (ANT1) from the transmit terminal 210 (TXA), or alternatively the first and second switches 221, 222 may be closed to shunt the first antenna terminal 213 (ANT1).

In a fourth example state, the switching circuit 200 does not utilize the first antenna terminal 213 (ANT1) and can provide a second transmit signal pathway between the second antenna terminal 214 (ANT2) and the transmit terminal 210 (TXA). The fourth state can be achieved by the following example configuration: closing the ninth and eighth switches 234, 228 to provide the signal pathway between the transmit terminal 210 (TXA) and the second antenna terminal 214 (ANT2); opening the fourth and tenth switches 225, 229, and closing the fifth switch 226, in order to shunt the receive terminal 211 (RXA) to ground and isolate the receive terminal 211 (RXA) from the signal pathway between the transmit terminal 210 (TXA) and the second antenna terminal 214 (ANT2); opening the sixth switch 231, and closing the seventh switch 232 in order to shunt the transceiver terminal 212 (TRXB) to ground and isolate the transceiver terminal 212 (TRXB) from the remaining terminals; opening the third and eleventh switches 223, 235 to prevent the transmit terminal 210 (TXA) and the second antenna terminal 214 (ANT2) from being shunted to ground, and opening one or both of the first and second switches 221, 222 to isolate the first antenna terminal 213 (ANT1) from the remaining terminals.

Although the following discusses the use of the four example states with reference to the example application of the switching circuit 200 to WiFi and Bluetooth, it is to be understood that the four states of the switching circuit 200 can be implemented in the context of any first and second wireless protocol pair where the first wireless protocol utilizes antenna diversity, and where the first and second wireless protocols may operate concurrently. For example, the first wireless protocol can be any of WiFi, SE2615, and SE2621.

The second and fourth states can provide for WiFi transmission diversity by providing to the transmit terminal access to respectively the first antenna terminal (second state) or the second antenna terminal (fourth state). In a case where the optimal polarization of the transmitted signal becomes more than 45° out of alignment with one of the first or the second antenna, the switching circuit 200 can switch which antenna the transmitter has access to, and hence provide access to the other antenna which is less than 45° out of alignment with the optimal polarization at which to transmit. This operation of the switching circuit 200 to provide for WiFi transmission diversity, by way of utilizing the second and fourth states can be referred to as the first mode of operation of the switching circuit 200.

As described herein, in the example architectures 100A 100B, switching between the two antennas can be problematic because there is a mismatch in the insertion loss from the transmitter to each of the two antennas to such a large degree that separate calibrations for power levels is likely required. As described herein for the example architectures 100A 100B, a calibration of the transmit power used for each antenna is likely required to compensate for approximately a 0.5 dB difference caused by the path losses between the transmit terminal and the respective antenna terminal.

In switching between the second and fourth state of the switching circuit 200, the use of two closed switches (e.g., the first switch 221 and the second switch 222) along the signal pathway between the transmit terminal 210 (TXA) and the first antenna 213 (ANT1) during the second state, can cause an insertion loss which matches that caused by the two closed switches (e.g., the ninth switch 223 and the eighth switch 234) along the signal pathway between the transmit terminal 210 (TXA) and the second antenna terminal 214 (ANT2) during the fourth state. A significant consequence of this insertion loss matching can include a feature where calibration testing and calibration dependent compensation performed during operation at the system level is simplified. Essentially, signal path selection to either the first or second antenna from the WiFi transmitter can become substantially transparent on the system level, eliminating or reducing the need to perform transmission power calibration and transmission power compensation, which translates to more efficient production and operation. Testing and calibration can be reduced during production because the transmission signal pathways have matching insertion loss and no power calibration is required to determine the level of power compensation. Functional and/or processing requirements during operation can also be reduced since the WiFi transmitter is no longer required to employ power compensation with a varying transmission power level which would normally be required to compensate for the varying insertion loss when switching between the transmit signal paths to the first and second antennas.

The first and second states can provide for concurrent use of the Bluetooth and WiFi devices coupled to the switching circuit 200, with the Bluetooth device being provided the capability to receive and transmit using the second antenna, while at the same time either the WiFi receiver (first state) or the WiFi transmitter (second state) can be provided access to the first antenna. Access to the first and second antennas can be provided with a high degree of isolation from each other due to the shunt to ground actuated by the eleventh switch 235 being situated between the WiFi and Bluetooth signal pathways. This example operation of the switching circuit 200 to enable substantially concurrent operation of WiFi and Bluetooth by way of utilizing the first and second states can be referred to as the second mode of operation of the switching circuit 200.

The first and third state can provide for WiFi reception diversity by providing to the receive terminal access to respectively the first antenna terminal (first state) or the second antenna terminal (third state). In a case where the polarization of the received signal goes beyond 45° out of alignment with one of the first or the second antenna, the switching circuit 200 can switch the antenna which the receiver has access to, and hence provide access to the other antenna with which the polarization of the received signal is less than 45° out of alignment. This example operation of the switching circuit 200 to provide for WiFi reception diversity, by way of utilizing the first and second states can be referred to as the third mode of operation of the switching circuit 200.

Due to the need for high sensitivity and hence low insertion loss for the signal path to the receiver in some situations, in the example embodiment depicted in FIG. 4, there is only one switch (e.g., the fourth switch 225) along the signal pathway from the receive terminal 211 (RXA) to the first antenna terminal 213 (ANT1). Calibration and compensation in the receive direction for WiFi diversity are typically not as important as they are in transmission diversity because the receiver typically operates to obtain the strongest signal possible.

As described herein, the switching circuit 200 can be configured to provide antenna sharing between equipment communicating with different wireless protocols, allowing for concurrent operation thereof with high isolation between the two. The switching circuit 200 can also allow for antenna diversity for communication equipment of one of the wireless protocols, while providing insertion loss matching of the signal paths utilized for transmission diversity.

Although in each of the examples described above, insertion loss matching has been achieved by including an identical number of switches along the first transmit signal pathway spanning the transmit terminal 210 (TXA) and the first antenna terminal 213 (ANT1) and along the second transmit signal pathway spanning the transmit terminal 210 (TXA) and the second antenna terminal 214 (ANT2), it is to be understood that in other embodiments any number of switches may be provided along the first transmit pathway as long as the insertion loss thereon equals or is similar to that of the second transmit pathway. For example, if the second switch 222 is replaced with two smaller switches which together when closed provide approximately the same insertion loss as the second switch 222, such two smaller switches can be used in place of the second switch 222. Moreover, given a total second pathway insertion loss substantially equal to the sum of the insertion loss caused by the ninth switch 228 and the insertion loss caused by the eighth switch 234, the second switch 222 can be replaced with any insertion loss component (otherwise having acceptable electrical properties), such as a resistor or other IC component. The insertion loss component on the first transmit signal pathway can be chosen to present an insertion loss substantially equal to the total insertion loss along the second transmit signal pathway minus the insertion loss caused by the remainder of the first transmit signal pathway. If the insertion loss component is a switch, such as the second switch 222, which moreover is a copy of the eighth switch 234, and if the first switch 221 is a copy of the ninth switch 228, then the insertion losses along the transmit signal pathways can substantially track with each other, in process, voltage, and/or temperature.

Figure 5:
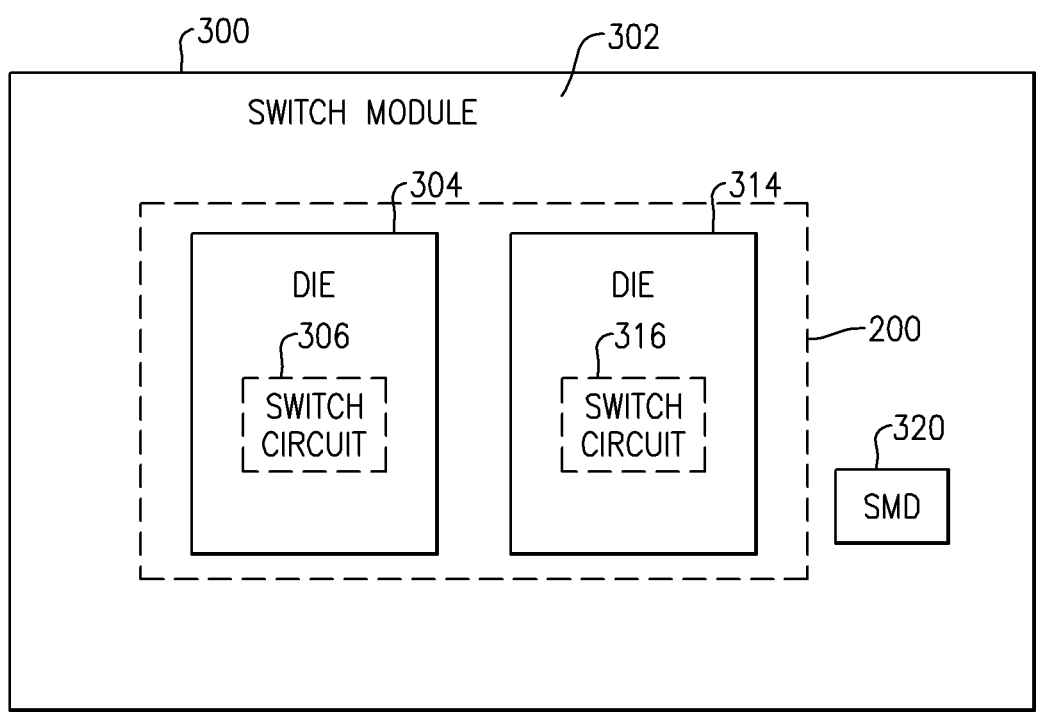
FIG. 5 shows an example module having one or more features of the present disclosure.

FIG. 5 shows that in some embodiments, a switching architecture having one or more features as described herein can be implemented in a packaged module 300 (e.g., a switch module). In some embodiments, such a module can include one or more silicon-on-insulator (SOI) die.

The example module 300 is shown to include an packaging substrate 302 configured to receive a plurality of components. In some embodiments, a plurality of dies 304, 314 having their respective switching circuits 306, 316 can be mounted on the substrate 302 and interconnected to yield a switching architecture 200 as described herein. In some embodiments, some or all of the dies 304, 314 can be implemented as SOI devices. In some embodiments, some or all of the components associated with the switching architecture 200 as described herein can be implemented on a single die (e.g., die 304). In some embodiments, such a single die can be an SOI die.

In some embodiments, the module 300 can also include one or more surface-mount devices (SMDs) (e.g., 320). In some embodiments, the packaging substrate 302 can include a laminate substrate.

In some embodiments, the module 300 can also include one or more packaging structures to, for example, provide protection and facilitate easier handling of the module 300. Such a packaging structure can include an overmold formed over the packaging substrate 302 and dimensioned to substantially encapsulate the various circuits and components thereon.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 6:
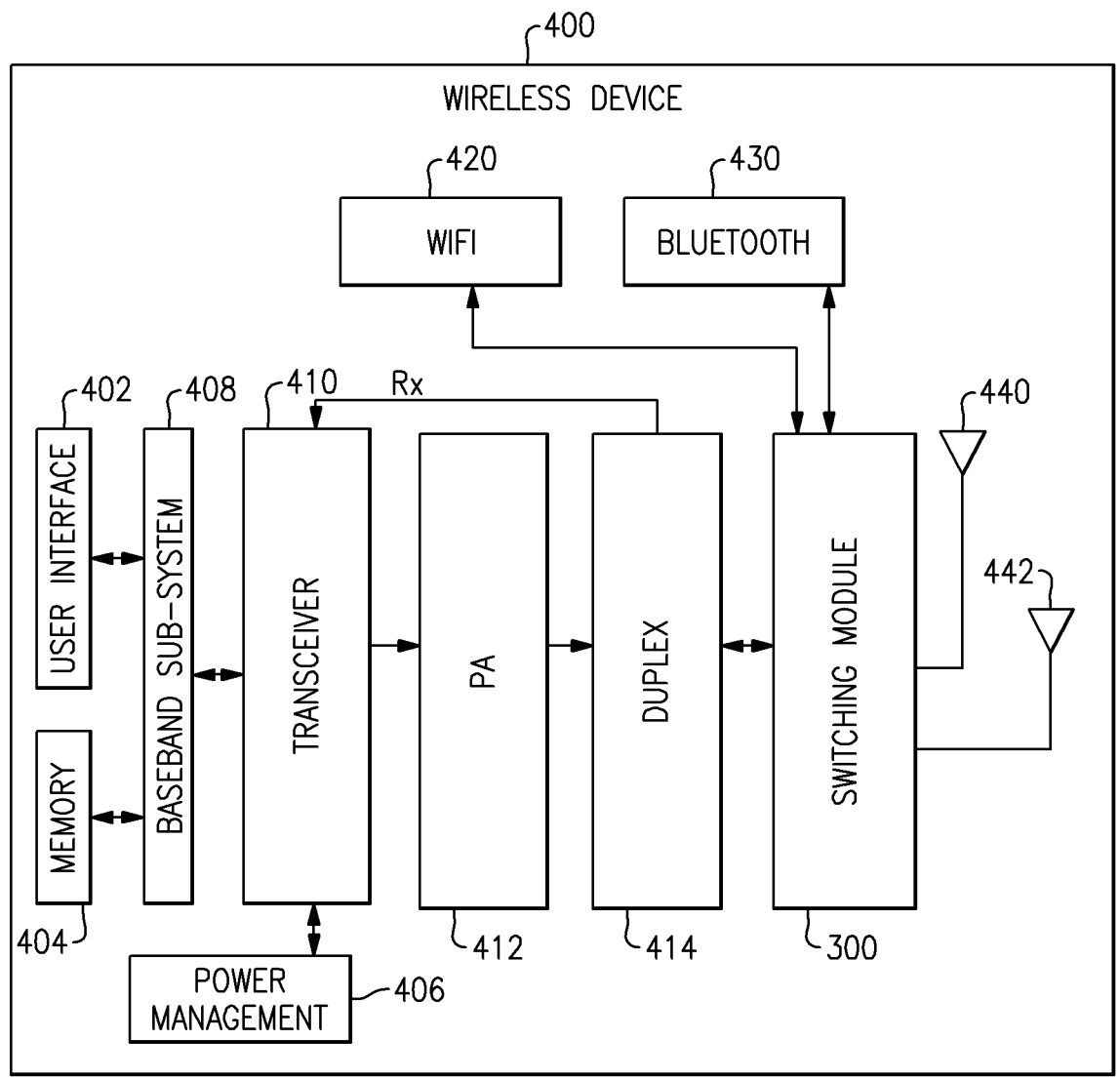
FIG. 6 shows an example wireless device having one or more features of the present disclosure.

FIG. 6 schematically depicts an example wireless device 400 having one or more advantageous features described herein. In the context of a switching architecture, one or more feature associated with such an architecture and described herein can be represented as switching module 300.

The switching module 300 shown to receive amplified signals from a power amplifier module 412 via a duplexer 414 and route such signals to one of a plurality of antennas 440, 442. Received RF signals from either of the antennas 440, 442 can be routed to a transceiver 410 by the switching module 300 and the duplexer 414. The transceiver 410 is also shown to generate the transmit signal for the foregoing amplification.

The transceiver 410 is also shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

The wireless device 400 is also shown to include a WiFi component 420 and a Bluetooth component 430. Such components can be interconnected to the antennas 440, 442 via the switching module 440 and be operated in advantageous manners as described herein. Other components such as GPS can also be included in the wireless device 400, and one or more features of the present disclosure can be applied to such other components.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A switching circuit comprising:
a first signal path between a transmit terminal and a first antenna terminal, the first final path including a first switch and an insertion loss component electrically connected in series;
a second signal path between the transmit terminal and a second antenna terminal, the second signal path including a second switch and a third switch electrically connected in series, the switching circuit configured to be capable of operating in a first mode in which the transmit terminal is provided with access to the first antenna terminal through the first signal path with a first insertion loss or the second antenna terminal through the second signal path with a second insertion loss, the insertion loss component including fourth switch implemented such that the first insertion loss substantially matches the second insertion loss; and
a third signal path between a transceiver terminal and the second antenna terminal, the switching circuit further configured to be capable of operating in a second mode in which the transmit terminal is provided with access to the first antenna terminal and the transceiver terminal is concurrently provided with access to the second antenna terminal.

2. The switching circuit of claim 1 further comprising a switchable shunt circuit that couples a node between the first switch and the transmit terminal with an electrical ground.

3. The switching circuit of claim 1 further comprising a switchable shunt circuit that couples a node between the second and third switches of the second signal path with an electrical ground.

4. The switching circuit of claim 1 wherein the third signal path is a bidirectional signal path.

5. The switching circuit of claim 1 further comprising a fourth signal path between a receive terminal and the first antenna terminal.

6. The switching circuit of claim 5 further comprising a fifth signal path between the receive terminal and the second antenna terminal.

7. The switching circuit of claim 6 wherein the switching circuit is further configured to be capable of operating in a third mode in which the receive terminal is provided with access to the first antenna terminal or the second antenna terminal.

8. The switching circuit of claim 6 wherein at least the first, second and third signal paths are formed on a common die.

9. The switching circuit of claim 1 wherein the transmit terminal is for connection to a transmitter operating in accordance with a first wireless protocol which utilizes transmission diversity, and the transceiver terminal is for connection to a transceiver operating in accordance with a second wireless protocol.

10. A die having a switching circuit, the die comprising:
a substrate that includes a semiconductor material;
a transmit terminal, a transceiver terminal, a first antenna terminal, and a second antenna terminal, each formed on the substrate;
a first signal path formed on the substrate, the first signal path configured to allow the transmit terminal to be in communication with the first antenna terminal with a first insertion loss, the first signal path including a first switch and an insertion loss component electrically connected in series;
a second signal path formed on the substrate, the second signal path configured to allow the transmit terminal to be in communication with the second antenna terminal with a second insertion loss, the second signal path including a second switch and a third switch electrically connected in series, the insertion loss component including a fourth switch implemented such that the first insertion loss substantially matches the second insertion loss; and
a third signal path formed on the substrate, the third signal path configured to allow the transceiver terminal to be in communication with the second antenna terminal.

11. The die of claim 10 wherein the die is a silicon-on-insulator (SOI) die.

12. A wireless device comprising:
a plurality of antennas including a first antenna and a second antenna;
a first radio-frequency (RF) circuit capable of being in communication with one or more of the plurality of antennas, the first RF circuit configured to operate with a first communication protocol;
a second RF circuit capable of being in communication with one or more of the plurality of antennas, the second RF circuit configured to operate with a second communication protocol; and
a switching module having a switching circuit implemented on a common die, the switching circuit configured to allow antenna-sharing and antenna-diversity among the first and second radio-frequency circuits operating with their respective communication protocols, the switching circuit including a first signal path between the first RF circuit and the first antenna and a second signal path between the first RF circuit and the second antenna, the first signal path including a first switch and an insertion loss component electrically connected in series and the second signal path including a second switch and a third switch electrically connected in series, the insertion loss component including a fourth switch implemented such that a first insertion loss of the first signal path substantially matches a second insertion loss of the second signal path.

13. The wireless device of claim 12 wherein the fourth switch is implemented as a copy of the third switch and the first switch is implemented as a copy of the second switch.

14. The wireless device of claim 12 wherein the first RF circuit includes a WiFi transmitter that operates without power compensation for transmissions to the first and second antennas.

15. The die of claim 10 wherein the fourth switch is implemented as a copy of the third switch and the first switch is implemented as a copy of the second switch.

16. The switching circuit of claim 1 wherein the fourth switch is implemented as a copy of the third switch.

17. The switching circuit of claim 16 wherein the first switch is implemented as a copy of the second switch.

18. The switching circuit of claim 17 wherein the first insertion loss and the second insertion loss substantially track one another in at least one of process, voltage, or temperature.

19. The switching circuit of claim 1 further including a double pole double throw (DPDT) switch, the DPDT switch including the first switch, the second switch, and the insertion loss component.

20. The switching circuit of claim 19 further including a single pole double throw (SPDT) switch, the SPDT switch including the third switch.

* * * * *